US009443909B2

(12) United States Patent
Lee

(10) Patent No.: US 9,443,909 B2
(45) Date of Patent: Sep. 13, 2016

(54) ELECTRONIC DEVICE AND METHOD FOR FABRICATING THE SAME

(71) Applicant: SK HYNIX INC., Icheon (KR)

(72) Inventor: Dong-Hyeon Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 78 days.

(21) Appl. No.: 14/229,588

(22) Filed: Mar. 28, 2014

(65) Prior Publication Data

US 2015/0123067 A1  May 7, 2015

(30) Foreign Application Priority Data

Nov. 7, 2013 (KR) .................. 10-2013-0134788

(51) Int. Cl.
  *H01L 27/24* (2006.01)
  *H01L 45/00* (2006.01)
  *H01L 27/22* (2006.01)

(52) U.S. Cl.
  CPC ......... *H01L 27/2481* (2013.01); *H01L 27/222* (2013.01); *H01L 27/224* (2013.01); *H01L 27/226* (2013.01); *H01L 27/2463* (2013.01); *H01L 45/04* (2013.01); *H01L 45/06* (2013.01); *H01L 45/08* (2013.01); *H01L 45/1226* (2013.01); *H01L 45/146* (2013.01); *H01L 45/147* (2013.01); *H01L 45/16* (2013.01)

(58) Field of Classification Search
  USPC .......................................... 257/40
  See application file for complete search history.

(56) References Cited

U.S. PATENT DOCUMENTS

| 2011/0085368 A1* | 4/2011 | Kim ............. H01L 27/222 365/63 |
| 2013/0153852 A1* | 6/2013 | Park ............. H01L 45/04 257/4 |
| 2014/0268995 A1* | 9/2014 | Joo .............. H01L 45/06 365/148 |

FOREIGN PATENT DOCUMENTS

KR   10-2013-0071006 A   6/2013

* cited by examiner

*Primary Examiner* — Zandra Smith
*Assistant Examiner* — Lawrence Tynes, Jr.

(57) ABSTRACT

An electronic device including a semiconductor memory includes a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate.

14 Claims, 12 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2013-0134788, entitled "ELECTRONIC DEVICE AND METHOD FOR FABRICATING THE SAME" and filed on Nov. 7, 2013, which is incorporated herein by reference in its entirety.

TECHNICAL FIELD

Embodiments of the present invention relates to electronic devices or systems including a memory device, and a method for fabricating the same.

BACKGROUND

As electronic appliances become smaller, semiconductor devices that have low power consumption, high performance, multi-functionality, and so on, are increasingly in demand. Semiconductor devices are devices that store information and are utilized in various electronic appliances such as computers, portable communication devices, and so on. Such semiconductor devices store data using a characteristic switching between different resistance states according to a voltage or current applied thereto. For example, semiconductor devices include resistive random access memory (RRMA) devices, phase change random access memory (PRAM) devices, ferroelectric random access memory (FRAM) devices, magnetic random access memory (MRAM) devices, E-fuses, etc.

SUMMARY

Embodiments of the present invention relate to a memory device, an electronic device including the same, and a method of fabricating the same, which has a high degree of integration. Embodiments also relate to a memory device, an electronic device including the same, and a method of fabricating the same, which has uniform cell characteristics and simplified fabrication process.

In one aspect, an electronic device including a semiconductor memory unit that includes: a plurality of first electrodes and a plurality of second electrodes stretched in a direction perpendicular to a substrate over the substrate and alternately arrayed in a first direction that is in parallel to the substrate; and a plurality of resistive variable patterns interposed between the first electrodes and the second electrodes in the first direction and stretched in the direction perpendicular to the substrate.

In another aspect, an electronic device including a semiconductor memory unit that includes: a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate.

Implementations of the above devices may include one or more of the following.

Upper surfaces of the first electrodes, the resistive variable patterns, and the second electrodes are positioned at the same level, and lower surfaces of the first electrodes and the resistive variable patterns are disposed below lower surfaces of the second electrodes. The semiconductor memory unit further comprises first insulation patterns disposed under the second electrodes. Each of the resistive variable patterns includes a plurality of layers which have resistive variable characteristics in combination, and a lowermost portion of a remaining layer other than a first layer that contacts the second electrodes among the plurality of layers has a shape of being bent toward the second electrodes in a direction parallel to the substrate, and the first insulation patterns cover at least the lowermost portion of the remaining layer. Each of the resistive variable patterns include an oxygen-rich metal oxide layer and an oxygen-deficient metal oxide layer, the oxygen-rich metal oxide layer and the oxygen-deficient metal oxide layer are stretched in the direction perpendicular to the substrate at least between the first electrodes and the second electrodes. Upper surfaces of the first electrodes, the resistive variable patterns and the second electrodes are positioned at the same level, and lower surfaces of the first electrodes, the resistive variable patterns and the second electrodes are positioned at the same level.

A cell structure includes the first electrodes, the second electrodes, and the resistive variable patterns that are arrayed in the first direction, and the cell structure is provided in plural and plural cell structures are arrayed to be spaced out from each other in a second direction that is parallel to the substrate and intersects with the first direction, and the first electrodes are arrayed in one row in the second direction, and the second electrodes are arrayed in one row in the second direction, and the resistive variable patterns are arrayed in one row in the second direction. Wherein the semiconductor memory unit further comprises first lines stretched in the first direction and electrically connected to the first electrodes that are arrayed in the first direction; and second lines stretched in the second direction and electrically connected to the second electrodes that are arrayed in the second direction, wherein ones between the first lines and the second lines are disposed over the cell structure and the others are disposed under the cell structure. Each of a first stack structure and a second structure includes the plural cell structures, and the first stack structure and the second structure are stacked in the direction perpendicular to the substrate. The semiconductor memory unit further comprises first lines stretched in the first direction under the first stack structure and electrically connected to the first electrodes that are included in the first stack structure and arrayed in the first direction; second lines stretched in the second direction between the first stack structure and the second stack structure, and electrically connected to the second electrodes that are included in the first stack structure and arrayed in the second direction and the second electrodes that are included in the second stack structure and arrayed in the second direction; and third lines stretched in the first direction over the second stack structure and electrically connected to the first electrodes that are included in the second stack structure and arrayed in the first direction. The semiconductor memory unit further comprises first lines stretched in the second direction under the first stack structure and electrically connected to the first electrodes that are included in the first stack structure and arrayed in the second direction; second lines stretched in the first direction between the first stack structure and the second stack structure, and electrically connected to the second electrodes that are included in the first stack structure and arrayed in the first direction and the second electrodes that are included in the second stack structure and arrayed in the first direction; and third lines stretched in the second direction over the second stack structure and electrically connected to the first electrodes that are included in the second stack structure and arrayed in the second direction.

Alternately, a cell structure includes the first electrodes, the second electrodes, the first insulation patterns under the second electrodes, and the resistive variable patterns that are arrayed in the first direction, and the cell structure is provided in plural and plural cell structures are arrayed to be spaced out from each other in a second direction that is parallel to the substrate and intersects with the first direction, and the first electrodes are arrayed in one row in the second direction, and the second electrodes are arrayed in one row in the second direction, and the resistive variable patterns are arrayed in one row in the second direction. Wherein the semiconductor memory unit further comprises first lines stretched in the first direction under the cell structure and electrically connected to the first electrodes that are arrayed in the first direction; and second lines stretched in the second direction over the cell structure and electrically connected to the second electrodes that are arrayed in the second direction. The semiconductor memory unit further comprises first lines stretched in the second direction under the cell structure and electrically connected to the first electrodes that are arrayed in the second direction; and second lines stretched in the first direction over the cell structure and electrically connected to the second electrodes that are arrayed in the first direction. Each of a first stack structure and a second structure includes the plural cell structures, and the first stack structure and the second structure are stacked in the direction perpendicular to the substrate. The first electrodes of the first stack structure overlap the second electrodes of the second stack structure in the first direction, and the second electrodes of the first stack structure overlap the first electrodes of the second stack structure in the first direction. The semiconductor memory unit further comprises first lines stretched in the first direction under the first stack structure and electrically connected to the first electrodes that are included in the first stack structure and arrayed in the first direction; second lines stretched in the second direction between the first stack structure and the second stack structure, and electrically connected to the second electrodes that are included in the first stack structure and arrayed in the second direction and the second electrodes that are included in the second stack structure and arrayed in the second direction; and third lines stretched in the first direction over the second stack structure and electrically connected to the second electrodes that are included in the second stack structure and arrayed in the first direction. The semiconductor memory unit further comprises first lines stretched in the second direction under the first stack structure and electrically connected to the first electrodes that are included in the first stack structure and arrayed in the second direction; second lines stretched in the first direction between the first stack structure and the second stack structure, and electrically connected to the second electrodes that are included in the first stack structure and arrayed in the first direction and the first electrodes that are included in the second stack structure and arrayed in the first direction; and third lines stretched in the second direction over the second stack structure and electrically connected to the second electrodes that are included in the second stack structure and arrayed in the second direction.

The semiconductor memory unit further comprises a plurality of selectors that are interposed between the first electrodes and the resistive variable patterns or between the second electrodes and the resistive variable patterns in the first direction and stretched in the direction perpendicular to the substrate.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, a method for fabricating an electronic device including a semiconductor memory unit includes: forming a plurality of first conductive patterns stretched in a second direction over a substrate and arrayed in a first direction to be spaced out from each other; forming a material layer pattern having resistive variable characteristics on sidewalls of each first conductive pattern; forming second conductive patterns each of which fills a space between the first conductive patterns where the material layer patterns are formed; and selectively etching the first conductive patterns, the material layer patterns, and the second conductive patterns in such a manner that the first conductive patterns, the material layer patterns, and the second conductive patterns are divided into more than two parts in the second direction.

In another aspect, a method for fabricating an electronic device including a semiconductor memory unit includes: forming a plurality of first conductive patterns that extends in a second direction over a substrate, each of the first conductive patterns being arrayed in a first direction and spaced apart from each other, the first direction crossing the second direction; forming a plurality of material layer patterns having resistance variable characteristics on sidewalls of the first conductive patterns; forming a plurality of second conductive patterns each of which fills a space between two neighboring material layer patterns; and dividing the first conductive patterns, the material layer patterns, and the second conductive patterns into two or more parts arrayed in the second direction by forming a trench between each of the parts, the trench extending in the first direction.

Implementations of the above methods may include one or more the following.

The method further comprises forming first insulation patterns each of which fills a lower portion of the space, before the forming of the second conductive patterns. The forming of the material layer pattern comprises forming a plurality of material layers conformally over the substrate where the first conductive patterns are formed, wherein the plurality of material layers have resistive variable characteristics in combination; and performing a blanket etch process on the material layers until upper surfaces of the first conductive patterns and the substrate are exposed.

These and other aspects, implementations and associated advantages will become apparent in view of the drawings and the description of embodiments provided herein, which are intended to provide further explanation of the invention as claimed.

DETAILED DESCRIPTION

Figure 1:
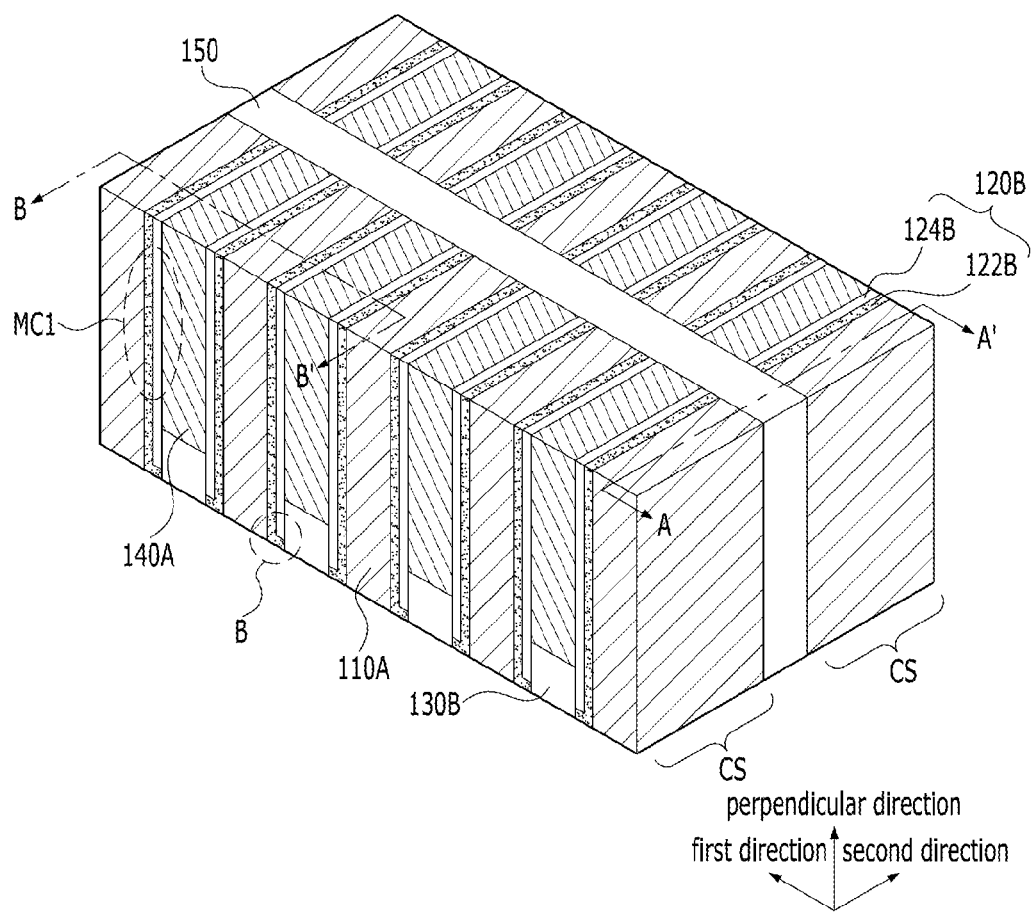
FIG. 1 is a perspective view illustrating a semiconductor device in accordance with a first embodiment of the present disclosure.

Embodiments of the present disclosure are described with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence of arraying the layers as shown reflects a particular implementation of an embodiment and a different relative positioning relationship or sequence of arraying the layers may be possible. In addition, an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating a semiconductor device in accordance with a first embodiment of the present disclosure.

Referring to FIG. 1, the semiconductor device includes a plurality of first electrodes 110A, a plurality of second electrodes 140A, and resistance variable patterns 120B. The first electrodes 110A and the second electrodes 140A are disposed over a substrate (not shown) and extend upwards from the substrate. The first electrode 110A and the second electrode 140A are alternately arrayed in a first direction that is parallel to a plane of the substrate. Each of the resistance variable patterns 120B is interposed between a first electrode 110A and a second electrode 140A.

The first electrode 110A and the second electrode 140A each contact a side of the resistance variable pattern 120B and supply a voltage or current to the resistance variable pattern 120B. Any of the first electrodes 110A and the second electrodes 140A may be formed of a conductive layer such as a metal layer, a metal nitride layer, a polysilicon layer doped with an impurity, or a combination thereof.

The resistance variable patterns 120B may be formed of a material having a resistance level that changes depending on a level of a voltage or current applied thereto. For example, the resistance variable patterns 120B may be formed of at least one of diverse materials used for an RRAM device, a PRAM device, a FRAM device, an MRAM device, and so forth. Such materials include metal oxide such as transition metal oxide and a perovskite-based material, a phase-change material such as a chalcogenide-based material, a ferroelectric material, and a ferromagnetic material. The resistance variable patterns 120B may have a single-layer structure or a multi-layer structure.

One memory cell may be formed of one first electrode 110A, one second electrode 140A, and one resistance variable pattern 120B interposed between the first electrode 110A and the second electrode 140A. For example, the first electrode 110A and the second electrode 140A on both sides of the resistance variable pattern 120B form a first memory cell MC1. Accordingly, a plurality of memory cells may be arrayed in series along the first direction. The first electrodes 110A, the resistance variable patterns 120B, and the second electrodes 140A, which are arrayed in the first direction, are referred to as cell structures CSs, hereafter.

Upper surfaces of the first electrode 110A, the resistance variable pattern 120B, and the second electrode 140A may be positioned at the same level. In other words, the first electrode 110A, the resistance variable pattern 120B, and the second electrode 140A may extend to substantially the same height from the substrate.

On the other hand, lower surfaces of the first electrode 110A, the resistance variable pattern 120B, and the second electrode 140A may be positioned at different levels. In an embodiment, the lower surface of the first electrode 110A and the lower surface of the resistance variable pattern 120B may be positioned lower than the lower surface of the second electrode 140A. Under the second electrode 140A is a first insulation pattern 130B filling a space between the second electrode 140A and the substrate. In short, an upper surface of the first insulation pattern 130B contacts the lower surface of the second electrode 140A, and the lower surface of the first insulation pattern 130B may be positioned at the same level as those of the lower surfaces of the first electrode 110A and the resistance variable pattern 120B. The first insulation pattern 130B is interposed between the second electrode 140A and the substrate due to a layer structure of the resistance variable pattern 120B, which will be described in detail below. According to another embodiment, the first insulation pattern 130B is omitted (refer to FIGS. 3A and 3B).

As mentioned above, the resistance variable pattern 120B may have a multi-layer structure including two or more layers. The two or more layers, in combination, have resistance variable characteristics. In an embodiment, the resistance variable pattern 120B has a dual-layer structure including a first resistance variable layer 122B and a second resistance variable layer 124B. One of the first resistance variable layer 122B and the second resistance variable layer 124B may be formed of an oxygen-deficient metal oxide material, and the other may be formed of an oxygen-rich metal oxide material.

The oxygen-rich metal oxide material may include a material that satisfies a stoichiometric ratio, such as titanium oxide ($TiO_2$) or tantalum oxide ($Ta_2O_5$). The oxygen-deficient metal oxide material may include a material having a less oxygen content than the oxygen-rich metal oxide material, such as titanium oxide ($TiO_x$), x being smaller than 2 (x<2), or tantalum oxide ($TaO_y$), y being smaller than 2.5 (y<2.5).

In an embodiment, the resistance state of the resistance variable pattern 120B may change between a high resistance level and a low resistance level according to whether or not oxygen vacancies of the oxygen-deficient metal oxide layer are supplied to the oxygen-rich metal oxide layer as a result of the voltage applied from the first electrode 110A and the second electrode 140A to the resistance variable pattern 120B. Thus, a filament current path is formed in the oxygen-rich metal oxide layer by the oxygen vacancies. The filament current path may be formed in a direction parallel to a surface of the substrate to couple the first electrode 110A and the second electrode 140A.

In the resistance variable pattern 120B having the dual-layer structure described above, the lowermost portion of the first resistance variable layer 122B may have a portion bent towards the second electrode 140A to be parallel to a surface of the substrate (refer to a circled region 'B'). That is, the first resistance variable layer 122B may have a portion that extends laterally below the second resistance variable layer 124B toward the second electrode 140A. This is due to characteristics of a subsequent etch process, which will be described with reference to FIG. 2B later.

The second resistance variable layer 124B may be positioned over the bent portion of the first resistance variable layer 122B. The upper surface of the first insulation pattern 130B may be positioned at a higher level than the bent portion of the first resistance variable layer 122B, so that the bent portion of the first resistance variable layer 122B does not contact the second electrode 140A. As described above, the resistance variable pattern 120B have a shape that extends upwards by a predetermined height from the substrate, and is provided at least between the first electrode 110A and the second electrode 140A.

In an embodiment, if the first insulation pattern 130B is omitted, that is, if the lower surface of the second electrode 140A is positioned at substantially the same level as that of the lower surface of the first electrode 110A, the second electrode 140A may contact not only the second resistance variable layer 124B, but also the bent portion of the first resistance variable layer 122B. This may cause a problem in a normal switching operation of a memory cell. However, as shown in FIG. 1, if the first insulation pattern 130B is formed to cover at least the lowermost portion of the resistance variable pattern 120B, it is possible to prevent the bent portion of the first resistance variable layer 122B from causing a problem in a normal switching operation.

This may be true not only for a resistance variable pattern 120B having a dual-layer structure, but also for a resistance variable pattern having a multi-layer structure of three or more layers. In a multi-layer structure, the layers that are not in contact with the second electrode 140A may have lowermost portions that are bent toward the second electrode 140A due to an etch process. The first insulation pattern 130B may be formed to fully cover the bent portions of these layers so that they do not contact the second electrode 140A. As a result, since all the multiple layers of the resistance variable pattern 120B may extend upwards by a predetermined height from the substrate 100 between the first electrode 110A and the second electrode 140A, upper surfaces of the first electrode 110A, the second electrode 140A, and the resistance variable pattern 120B are provided at substantially the same level over the substrate 100. Thus, a memory cell may obtain its operational characteristics.

In an embodiment, the above-described cell structure CS is iteratively arrayed in a second direction, which crosses the first direction. FIG. 1 illustrates two cell structures CS each extending in the first direction, and the cell structures CS that are iteratively arrayed in the second direction with a second insulation pattern 150 provided between the cell structures arrayed in the second direction. That is, the second insulation pattern 150 extends in the first direction and is interposed between two neighboring cell structures CS to isolate the cell structures CS from each other. Thus, the first electrodes 110A included in each cell structure CS are arrayed in series in the second direction. Similarly, the resistance variable patterns 120B and the second electrodes are also arrayed in series in the second direction.

FIGS. 2A to 2E are cross-sectional views illustrating a method for fabricating the semiconductor device shown in FIG. 1. In each of FIGS. 2A to 2E, a left portion shows a cross-sectional view taken along the line A-A' of FIG. 1, and a right portion shows a cross-sectional view taken along the line B-B' of FIG. 1.

Figure 2A:
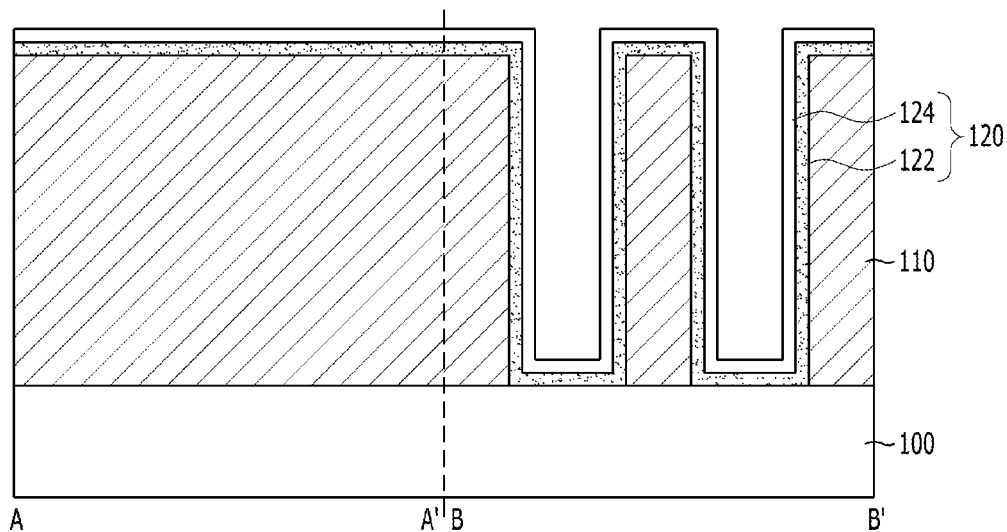
FIGS. 2A to 2E are cross-sectional views illustrating a method for fabricating the semiconductor device shown in FIG. 1.

Referring to FIG. 2A, a conductive material is deposited on a substrate 100 including a predetermined lower structure (not shown), and then the conductive material is patterned so that a plurality of first conductive patterns 110 is formed in a shape of lines extending in the second direction. The first conductive patterns 110 are arrayed to be spaced apart from each other in the first direction.

Subsequently, a material layer 120 having variable resistance characteristics is formed over a resultant structure, including the first conductive patterns 110. The material layer 120 includes a first material layer 122 and a second material layer 124. The first material layer 122 is formed over the resultant structure, and the second material layer 124 is formed over the first material layer 122. The first material layer 122 and the second material layer 124 together show the variable resistance characteristics. In an embodiment, one of the first material layer 122 and the second material layer 124 includes an oxygen-rich metal oxide layer, and the other includes an oxygen-deficient metal oxide layer.

Figure 2B:
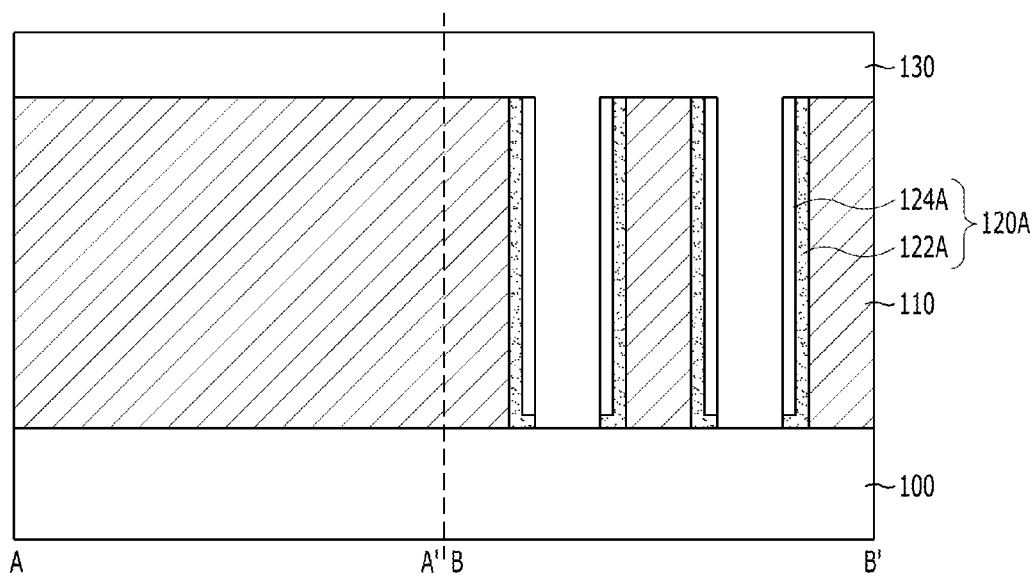

Referring to FIG. 2B, a material layer pattern 120A is formed on each sidewall of each first conductive pattern 110 by performing a blanket etch process on the material layer 120 until upper surfaces of the first conductive patterns 110 and the substrate 100 are exposed. The material layer patterns 120A extend in the second direction, like the first conductive patterns 110. The material layer pattern 120A includes a first material layer pattern 122A and a second material layer pattern 124A, which are formed by the blanket etch process. In the material layer pattern 120A, the first material layer pattern 122A is formed to have the lowermost portion that is bent in a direction away from the first conductive pattern 110. That is, the first material layer pattern 122A covers one side and the bottom of the second material layer pattern 124A.

Subsequently, an insulation material 130 is deposited over a resultant structure, including the material layer pattern 120A, to fill the space between the first conductive patterns 110 where the material layer pattern 120A is formed. The insulation material 130 has excellent gap-filling characteristics and may include a Spin-On-Dielectric (SOD) substance.

Figure 2C:
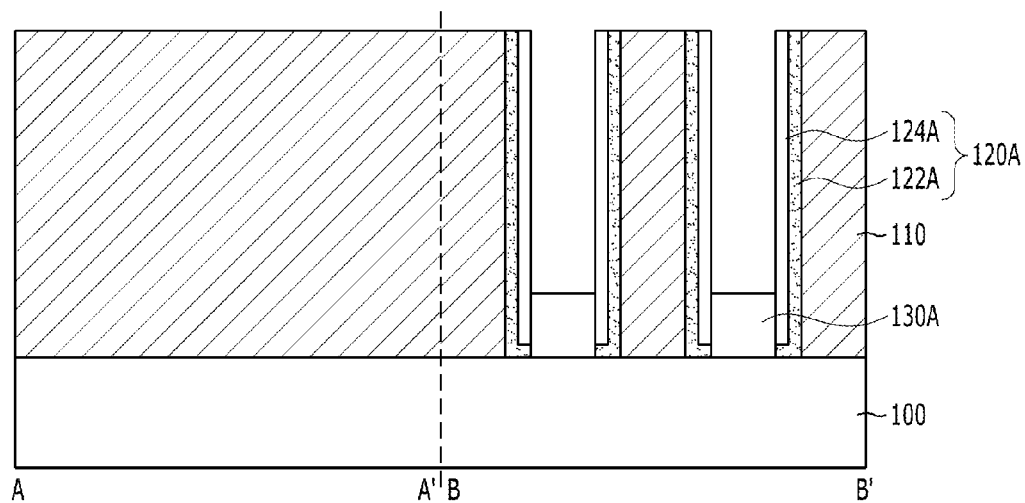

Referring to FIG. 2C, insulation patterns 130A are formed to fill a portion of the space between the first conductive patterns 110 after the material layer pattern 120A is formed. The insulation pattern 130A is formed to cover the bent portion of the first material layer pattern 122A, and is formed by removing a portion of the insulation material 130 through a Chemical Mechanical Polishing (CMP) process, an etch-back process, or a combination thereof. The insulation patterns 130A may include line shapes extending in the second direction.

Figure 2D:
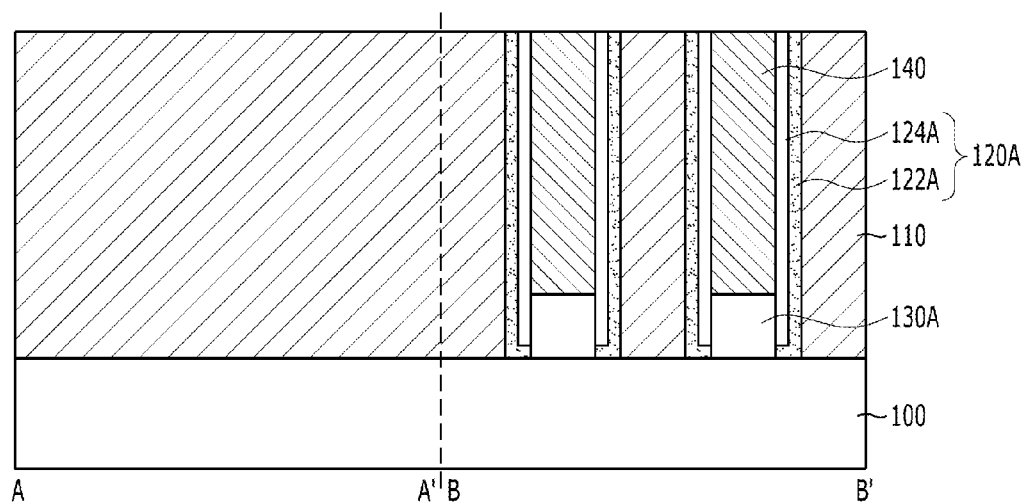

Referring to FIG. 2D, second conductive patterns 140 are formed to fill the space between the first conductive patterns 110 after the material layer pattern 120A and the insulation patterns 130A are formed. The second conductive patterns 140 are formed by depositing a conductive material over a structure resulting from the process of FIG. 2C, and planarizing the deposited conductive material through a CMP process until the upper surfaces of the first conductive patterns 110 are exposed. The second conductive patterns 140 may include line shapes extending in the second direction.

After that, one or more trenches are formed to extend in the first direction while penetrating through the first conductive patterns 110, the material layer patterns 120A, the insulation patterns 130A, and the second conductive patterns 140 by selectively etching the first conductive patterns 110, the material layer patterns 120A, the insulation patterns 130A, and the second conductive patterns 140. As a result, the first conductive pattern 110, the material layer pattern 120A, the insulation pattern 130A, and the second conductive pattern 140 are separated into two or more parts in the second direction.

Figure 2E:
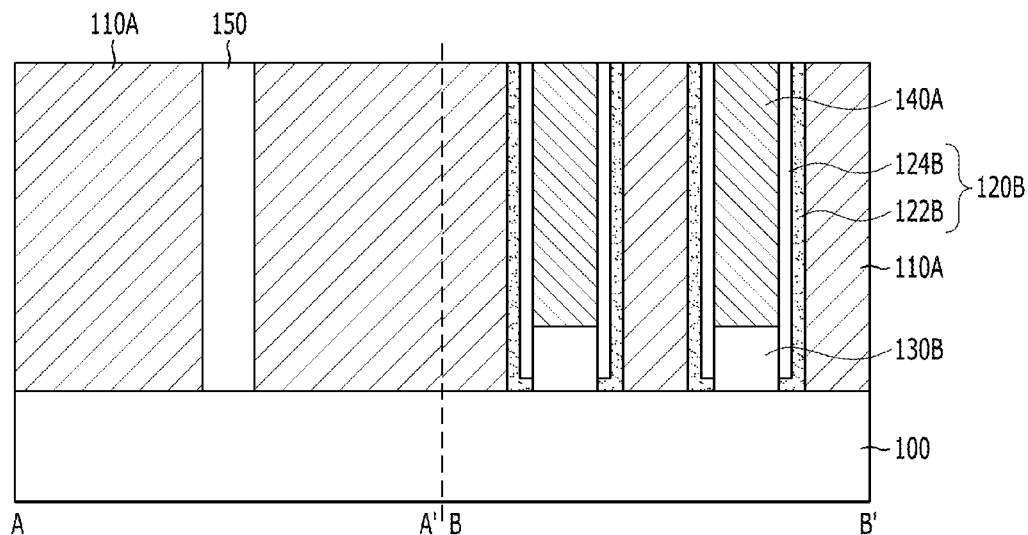

In FIG. 2E, one trench is formed, and accordingly, the first conductive pattern 110, the material layer pattern 120A, the insulation pattern 130A, and the second conductive pattern 140 are divided into two parts in the second direction. However, embodiments of the present disclosure are not limited thereto. In another embodiment, the first conductive pattern 110, the material layer pattern 120A, the insulation pattern 130A, and the second conductive pattern 140 are divided into more than two parts in the second direction according to the number of the trenches. As a result of the dividing process, the first electrodes 110A, the resistance variable patterns 120B, the first insulation patterns 130B, and the second electrodes 140A are formed. The first electrodes 110A, the resistance variable patterns 120B, the first insulation patterns 130B, and the second electrodes 140A correspond to the first conductive patterns 110, the material layer patterns 120A, the insulation patterns 130A, and the second conductive patterns 140, respectively.

Subsequently, the second insulation pattern 150 is formed by filling the trench with an insulation material such as oxide or nitride. As a result, a semiconductor device in accordance with an embodiment as illustrated in FIG. 1 is obtained.

The embodiment of FIGS. 1 to 2E described above has the following advantages.

First of all, in the above-described embodiment, a plurality of memory cells in a cell structure CS is arrayed in the first direction, and a mask process, which is an essential process for forming a memory cell array, is required only one time to form the memory cell array. For example, the resistance variable patterns 120B and the second electrodes 140A are formed in a process of filling the space between the first electrodes 110A without performing an additional mask process. Moreover, since the first electrodes 110A, the resistance variable patterns 120B, and the second electrodes 140A are alternate laterally in a pattern across a surface of the substrate 100 and extend vertically from the substrate 100 to form a single vertical layer comprised of a plurality of parts, it is easy to perform an etch process to form the first electrodes 110A, the resistance variable patterns 120B, and the second electrodes 140A. As a result, a process for fabricating a semiconductor device is simplified. Furthermore, it is possible to realize a highly integrated memory device through the simplified fabricating process.

In addition, a desired etch profile may be easily obtained according to the above-described processes, and thus the shapes of the first electrodes 110A, the resistance variable patterns 120B, and the second electrodes 140A may be uniformly formed. As a result, it is possible to obtain uniformity in the characteristics of multiple memory cells.

Furthermore, although the resistance variable patterns 120B are of a multi-layer structure, it is possible to obtain switching characteristics.

Figure 3A:
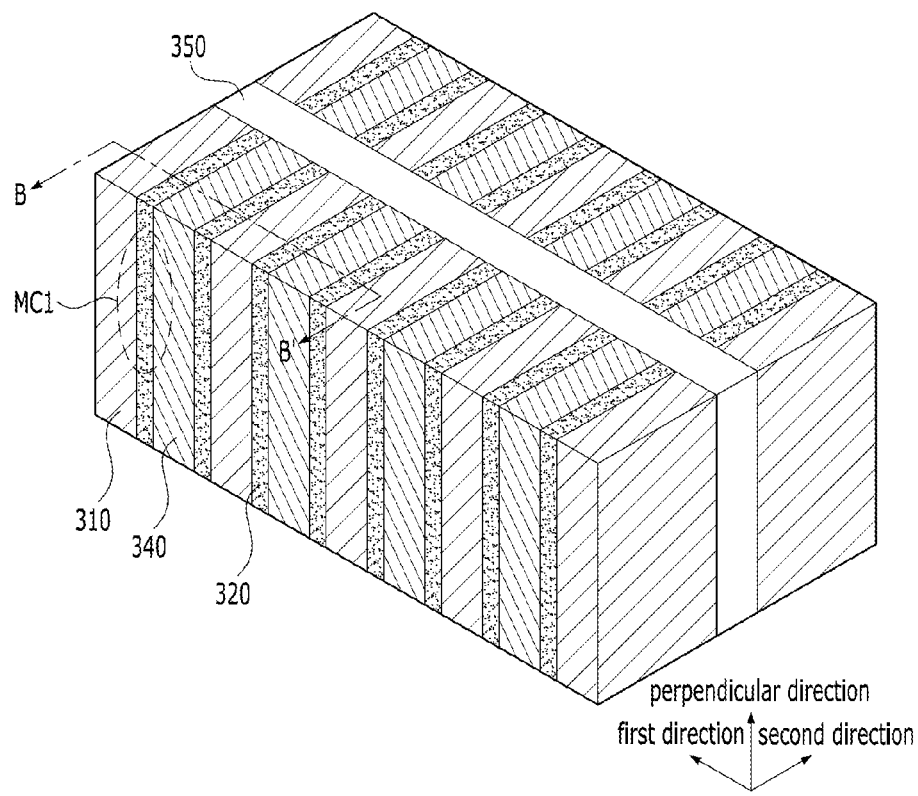
FIG. 3A is a perspective view illustrating a semiconductor device in accordance with a second embodiment of the present disclosure.
Figure 3B:
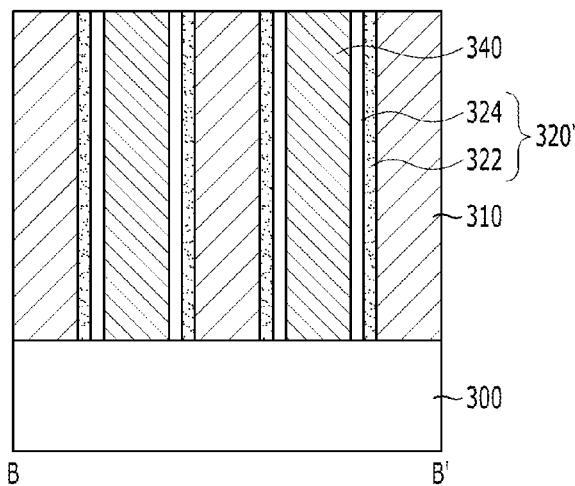
FIG. 3B is a cross-sectional view illustrating a semiconductor device in accordance with a third embodiment of the present disclosure.

FIG. 3A is a perspective view illustrating a semiconductor device in accordance with a second embodiment of the present disclosure, and FIG. 3B is a cross-sectional view illustrating a semiconductor device in accordance with a third embodiment of the present disclosure. Hereafter, a description of the second and third embodiments will focus on differences from the first embodiment illustrated in FIG. 1.

Referring to FIG. 3A, the semiconductor device includes a plurality of first electrodes 310, a plurality of second electrodes 340, and resistance variable patterns 320. The first electrodes 310 and the second electrodes 340 are disposed over a substrate (not shown) and extend upwards from the substrate to a predetermined height. The first electrode 310 and the second electrode 340 are alternately arrayed in a first direction that is parallel to a plane of the substrate. Each of the resistance variable patterns 320 is interposed between a first electrode 310 and a second electrode 340.

In the embodiment shown in FIG. 3A, the resistance variable pattern 320 has a single-layer structure extending upwards by a predetermined height from the substrate. A second insulation pattern 350 is formed to isolate neighboring cell structures from each other in the second direction.

In another embodiment, the resistance variable pattern 320 may have a multi-layer structure, and each of the multiple layers extends upwards by a predetermined height from the substrate. However, each of the multiple layers does not have a bent portion, unlike the first resistance variable layer 122B of the resistance variable pattern 120B. In other words, all of the layers of the multi-layer structure that form the resistance variable pattern 320 between the first electrode 310 and the second electrode 340 are straight and extend upwards from the substrate by a predetermined height from the substrate. This embodiment is illustrated in FIG. 3B.

Referring to FIG. 3B, the resistance variable pattern 320 is formed to have a dual-layer structure that includes a first material layer pattern 322 and a second material layer pattern 324. The first material layer pattern 322 is formed on each sidewall of each of the first electrodes 310 by forming a first material layer over a resultant structure after the formation of the first electrodes 310 and performing a blanket etch process on the first material layer. Subsequently, the second material layer pattern 324 is formed on an exposed sidewall of the first material layer pattern 322 by forming a second material layer over a resultant structure after the formation of the first material layer pattern 322, and then performing a blanket etch process on the second material layer. When the second material layer patterns 324 are formed in this way, the first material layer patterns 322 may not contact the second electrodes 340, each of which is buried in a trench region between two adjacent second material layer patterns 324.

In this embodiment, the first insulation patterns 130B shown in FIG. 1 are omitted, and the first electrodes 310, the resistance variable patterns 320', and the second electrodes 340 are all positioned at the same level. Upper and lower surfaces of the first electrodes 310, the resistance variable patterns 320', and the second electrodes 340 may be positioned to have substantially the same height from the substrate.

In an embodiment of the present disclosure, the first electrodes 110A (or 310) and the second electrodes 140A (or 340) are electrically connected to lines, e.g., voltage supplying lines through which an operating voltage for performing an operation of a memory cell is supplied. The lines may be realized in diverse forms. In an embodiment, the lines are formed as shown in FIGS. 4A to 5 to achieve high integration and simplify a fabricating process.

Figure 4A:
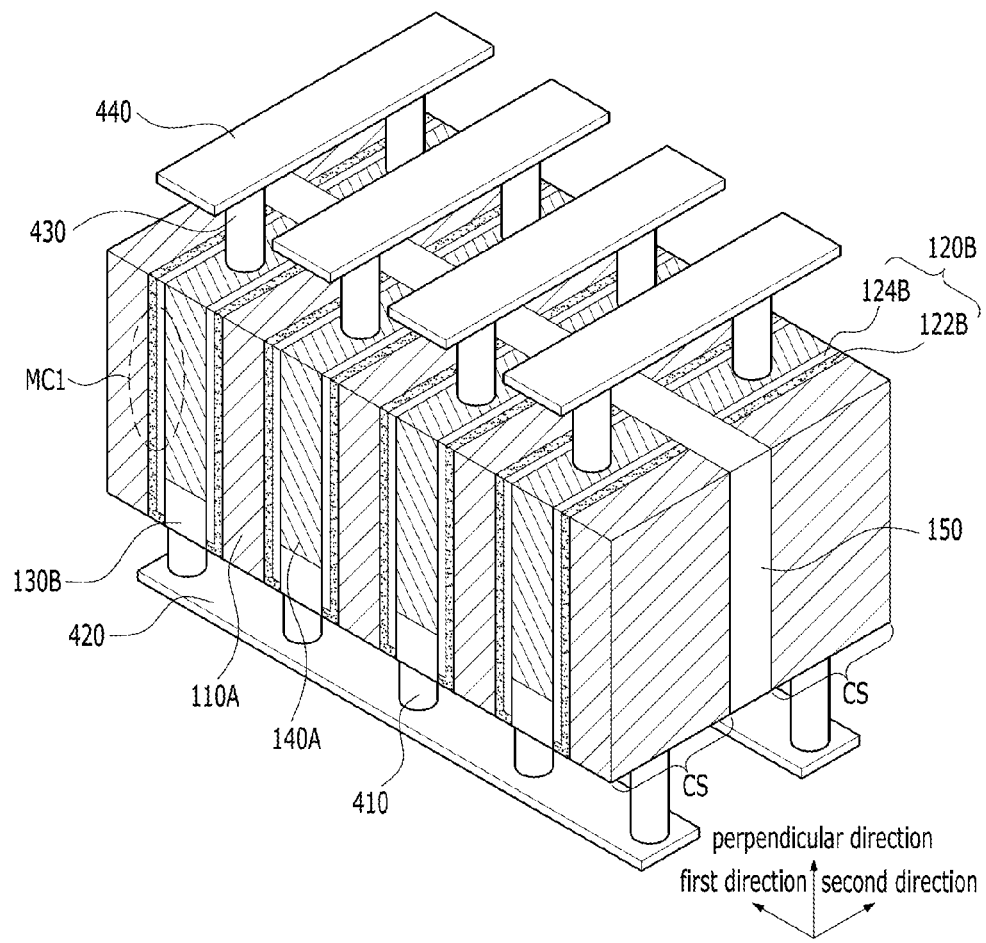
FIG. 4A is a perspective view illustrating a semiconductor device including voltage supplying lines in accordance with an embodiment of the present disclosure.
Figure 4B:
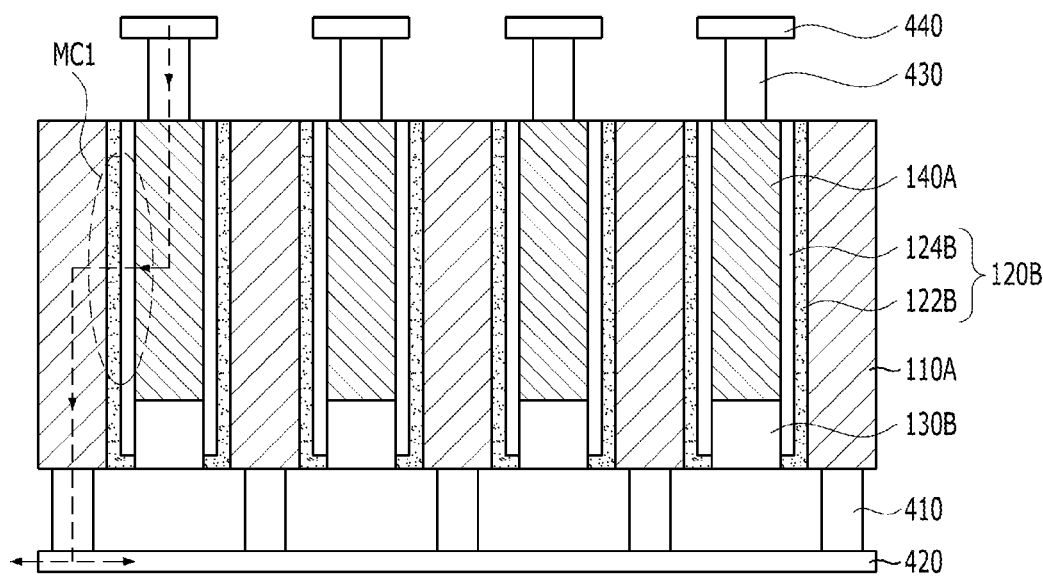
FIG. 4B is a cross-sectional view illustrating the semiconductor device of FIG. 4A taken along a line that extends in a first direction.
Figure 5:
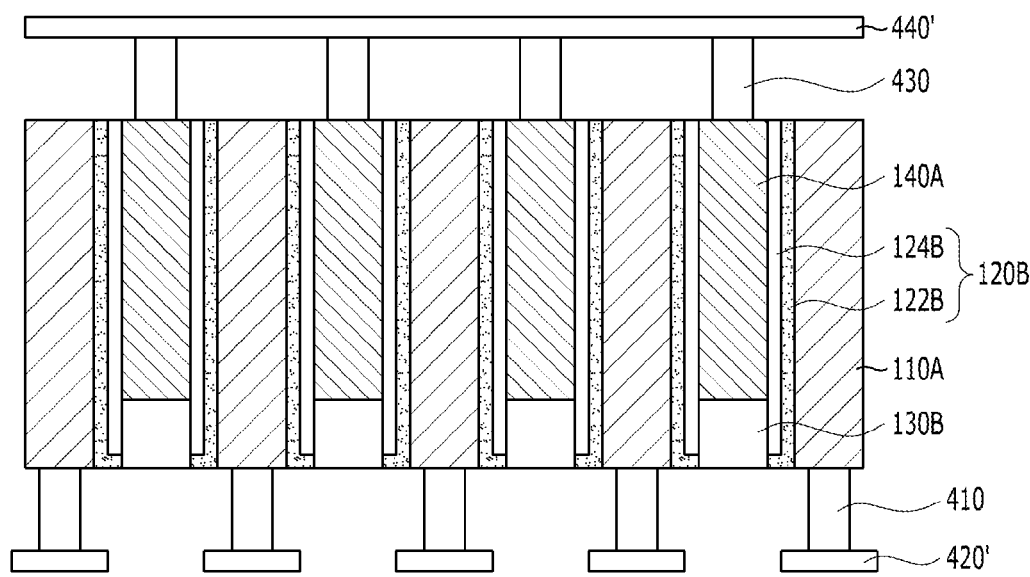
FIG. 5 is a cross-sectional view illustrating a semiconductor device including voltage supplying lines in accordance with another embodiment of the present disclosure.

FIG. 4A is a perspective view illustrating a semiconductor device including voltage supplying lines in accordance with an embodiment of the present disclosure, and FIG. 4B is a cross-sectional view illustrating the semiconductor device of FIG. 4A taken along a line in the first direction. FIGS. 4A and 4B illustrate a cell structure that is substantially the same as that of the semiconductor device shown in FIG. 1. However, embodiments are not limited thereto. Voltage supplying lines may be connected to a cell structure having a different configuration. For example, in another embodiment, the voltage supplying lines shown in FIGS. 4A and 4B may be connected to the cell structure shown in any of FIGS. 3A and 3B.

Referring to FIGS. 4A and 4B, first lines 420 extending in a first direction are disposed under cell structures, which correspond to the cell structures CS shown in FIG. 1. A plurality of first electrodes 110A in each cell structure CS is electrically connected to a corresponding one of the first lines 420. In particular, each of the first electrodes 110A is electrically connected to a first line 420 through a corresponding one of the first contacts 410, which are respectively coupled to the first electrodes 110A and disposed under the first electrodes 110A.

Disposed over the cell structures CS are second lines 440, which extend in a second direction. Second electrodes 140A that are iteratively arrayed to form two or more cell structures CS along one straight line extending in the second direction may be referred to as a column of the second electrodes 140A. A column of the second electrodes 140A is electrically coupled to a corresponding one of the second lines 440. Particularly, each of the second electrodes 140A in the column is electrically coupled to the corresponding second line 440 through a corresponding one of second contacts 430, which are respectively coupled to the second electrodes 140A and disposed over the second electrodes 140A.

The first contacts 410, the first lines 420, the second contacts 430, and the second lines 440 may be formed of any conductive material, including metal, a metallic material such as metal nitride, and so on. The space between the first lines 420 and the first contacts 410 and the space between the second contacts 430 and the second lines 440 may be filled with an insulating substance, which is not illustrated in the drawings.

In the semiconductor device shown in FIGS. 4A and 4B, when a read operation for reading data stored in a first memory cell MC1 is performed or when a program operation for programming data in the first memory cell MC1 is performed, a required operating voltage is applied to the first line 420 and the second line 440, which are respectively coupled to the first electrode 110A and the second electrode 140A of the first memory cell MC1. As a result, a current flow may be generated through the first memory cell MC1 between the second line 440 and the first line 420 as shown in FIG. 4B. The other first lines 420 and the other second lines 440 that are not coupled to the first memory cell MC1 may be in a floating state or may receive a predetermined voltage such as a ground voltage.

According to an embodiment, as shown in FIGS. 4A and 4B, since the first lines 420 and the second lines 440 are disposed under or over the cell structures CS, memory cells in the cell structures CS may be easily controlled without affecting a degree of integration of the semiconductor device. Also, since the first and second contacts 410 and 430 and the first and second lines 420 and 440 are formed in an iterative form, a fabricating process of the semiconductor device becomes simple. Furthermore, since the first lines 420 and the second lines 440 are respectively disposed under and over the cell structures CS, a short circuit between the first contacts 410 and the second contacts 430 may be prevented.

Meanwhile, in accordance with an embodiment as shown in FIGS. 4A and 4B, the first lines 420 are coupled to the first electrodes 110A under the cell structures CS and the second lines 440 are coupled to the second electrodes 140A over the cell structures CS due to the presence of the first insulation patterns 130B under the second electrodes 140A. However, in another embodiment, if the first insulation patterns 130B are omitted, for example, as illustrated in FIG. 3, the positions of the first lines 420 and the second lines 440 may be switched. That is, the first lines 420 may be disposed over the cell structures CS, and the second lines 440 may be disposed under the cell structures CS.

In another embodiment, the directions of the first lines 420 and the second lines 440 may be changed as long as the first lines 420 and the second lines 440 cross each other, as illustrated, for example, in FIG. 5.

FIG. 5 is a cross-sectional view illustrating a semiconductor device including voltage supplying lines in accordance with another implementation of the present disclosure.

Referring to FIG. 5, first lines 420' are formed to extend in a second direction under cell structures CS. A column of the first electrodes 110A iteratively arrayed to form two or more cell structures CS is electrically coupled to a corresponding one of the first lines 420'.

Also, second lines 440' are formed to extend in a first direction over the cell structures CS. A column of the second electrodes 140A arrayed in the first direction is electrically coupled to a corresponding one of the second lines 440'.

Since an operation of a memory cell shown in FIG. 5 is substantially the same as that of the memory cell MC1 shown in FIGS. 4A and 4B, a detailed description thereof is not provided herein for the simplicity of explanation.

In this embodiment, the first lines 420' are coupled to the first electrodes 110A under the cell structures CS, and the second lines 440' are coupled with the second electrodes 140A over the cell structures CS due to the presence of the first insulation patterns 130B under the second electrodes 140A. However, in another embodiment, if the first insulation patterns 130B are omitted, for example, as illustrated in FIG. 3, positions of the first lines 420' and the second lines 440' may be switched. That is, the first lines 420' may be disposed over the cell structures CS, and the second lines 440' may be disposed under the cell structures CS.

In another embodiment, any structure of FIGS. 1, 3A, and 3B may be stacked two or more times in a vertical direction. This will be described with reference to FIG. 6.

Figure 6:
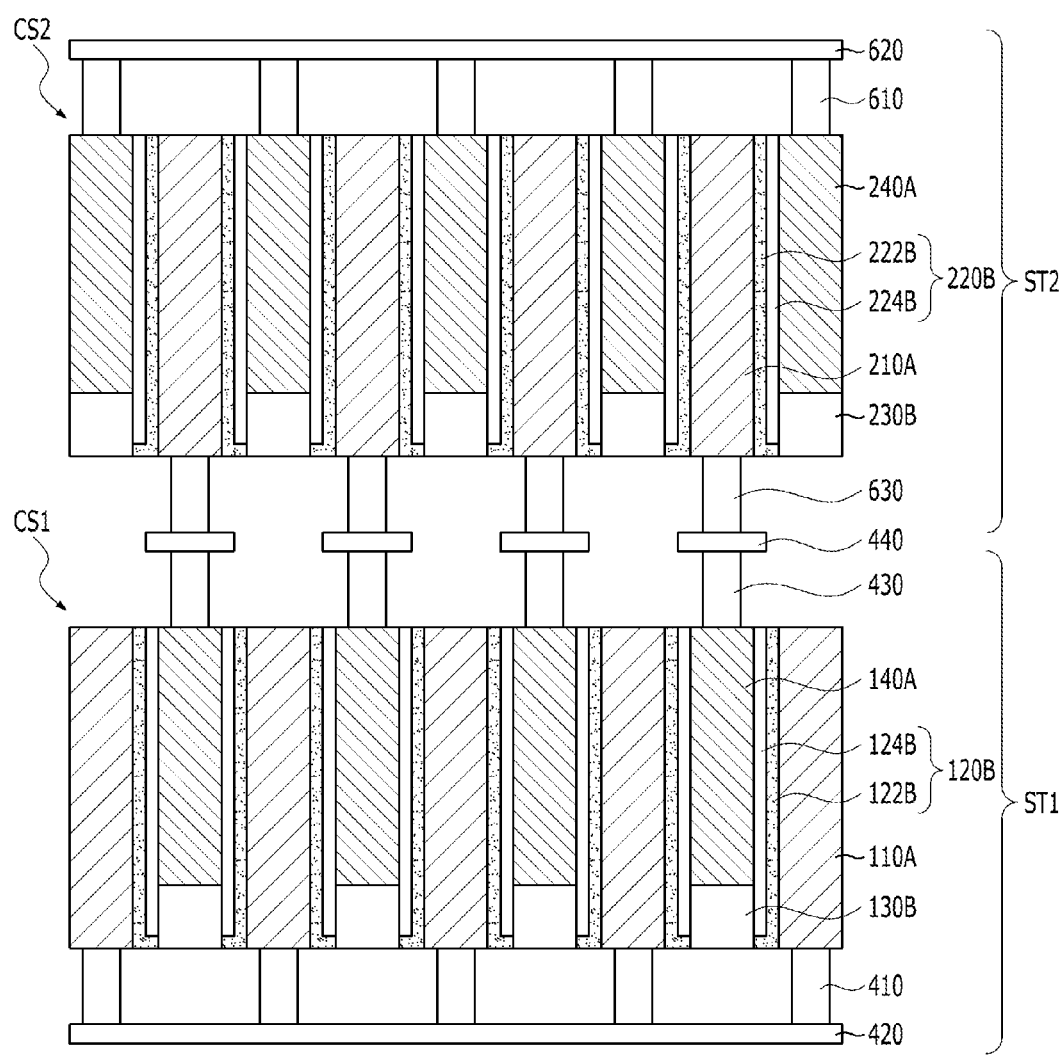
FIG. 6 is a cross-sectional view illustrating a semiconductor device including a stacked cell structure in accordance with an embodiment of the present disclosure.

FIG. 6 is a cross-sectional view illustrating a semiconductor device including a stacked cell structure in accordance with an embodiment of the present disclosure.

Referring to FIG. 6, each of a first stack structure ST1 and a second stack structure ST2 includes a cell structure in accordance with an embodiment. FIG. 6 illustrates a cell structure that is substantially the same as the cell structure illustrated in FIG. 1, but embodiments are not limited thereto. The first stack structure ST1 includes a first cell structure CS1, and the second stack structure ST2 includes a second cell structure CS2.

First electrodes 110A of the first stack structure ST1 are electrically connected through first contacts 410 to first lines 420 that are disposed under the first cell structure CS1 and extend in a first direction. Second electrodes 140A of the first stack structure ST1 are electrically connected through second contacts 430 to second lines 440 that are disposed over the first cell structure CS1 and extend in a second direction.

The second stack structure ST2 shares the second lines 440 with the first stack structure ST1. Thus, first electrodes 210A of the second stack structure ST2 are electrically connected through third contacts 630 to the second lines 440 that are disposed under the second cell structure CS2. Second electrodes 240A of the second stack structure ST2 are electrically connected through fourth contacts 610 to third lines 620 that are disposed over the second cell structure CS2 and extend in the first direction.

As described above, the first electrodes 110A and 210A are electrically connected to the lines under the cell structures CS1 and CS2, respectively, due to the presence of first insulation patterns 130B and 230B. However, since the second lines 440, which are coupled to the first electrodes 210A of the second stack structure ST2, are also coupled to the second electrodes 140A of the first stack structure ST1, the first electrodes 210A of the second stack structure ST2 and the second electrodes 140A of the first stack structure ST1 may be aligned. That is the first electrodes 210A and the second electrodes 140A may be parallel to and overlap with each other. In addition, the second electrodes 240A of the second stack structure ST2 and the first electrodes 110A of the first stack structure ST1 may be aligned to be parallel to and overlap with each other.

To be specific, the first electrodes 110A and the second electrodes 140A of the first stack structure ST1 and the first electrodes 210A and the second electrodes 240A of the second stack structure ST2, respectively, alternate with each other in the first direction. When it is assumed that the first electrodes 110A and the second electrodes 140A of the first stack structure ST1 are in odd-numbered positions and even-numbered positions, respectively, in the first direction, the first electrodes 210A and the second electrodes 240A of the second stack structure ST2 are in even-numbered positions and odd-numbered positions, respectively, in the first direction.

Although FIG. 6 shows a case where the cell structure of FIG. 1 is stacked two times, embodiments are not limited thereto. In another embodiment, the cell structure of FIG. 1 may be stacked more than two times. If a third stack structure (not shown) is disposed over the second stack structure ST2, the third stack structure may have substantially the same configuration as that of the first stack structure ST1, except for the first lines 420. For the third stack structure, the first lines 420 may be substituted with the third lines 620. Similarly, if a fourth stack structure (not shown) is stacked over the third stack structure, the fourth stack structure may have substantially the same configuration as that of the second stack structure ST2. Other stack structures may be stacked in the same manner as described above.

Although FIG. 6 shows that the first lines 420 and the third lines 620 extend in the first direction while the second lines 440 extend in the second direction, the directions in which these lines extend may be reversed. That is, the first lines 420 and the third lines 620 may extend in the second direction while the second lines 440 may extend in the first direction.

Also, although FIG. 6 shows that the cell structure of FIG. 1 is stacked two times, it is possible to stack the cell structure of FIG. 3A or 3B two or more times according to another embodiment. If the cell structure of FIG. 3A or 3B is stacked two or more times, the second electrodes 340 of the cell structure of FIG. 3 may be coupled with any of lines over the cell structure or lines under the cell structure since the cell structure of FIG. 3 does not include an insulation pattern such as the first insulation patterns 130B in FIG. 1. Thus, if a first stack structure and a second stack structure, which include the cell structure of FIG. 3, are vertically stacked, first electrodes of the first stack structure can be aligned with the first electrodes of the second stack structure so that they are parallel to and overlap with first electrodes of the second stack structure. In addition, second electrodes of the first stack structure can be aligned with second electrodes of the second stack structure so that they are parallel to and overlap with second electrodes of the second stack structure.

In another embodiment, the semiconductor devices described above may further include a selection unit interposed between electrodes and resistance variable patterns to supply a current to the resistance variable patterns. This will be described with reference to FIGS. 7A to 8.

Figure 7A:
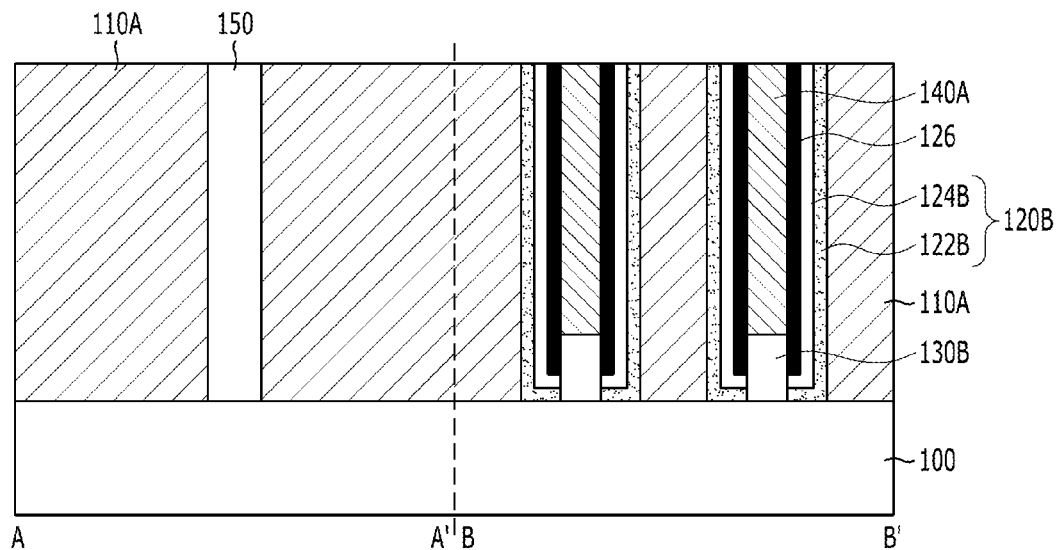
FIG. 7A is a cross-sectional view illustrating a semiconductor device in accordance with a fourth embodiment of the present disclosure.
Figure 7B:
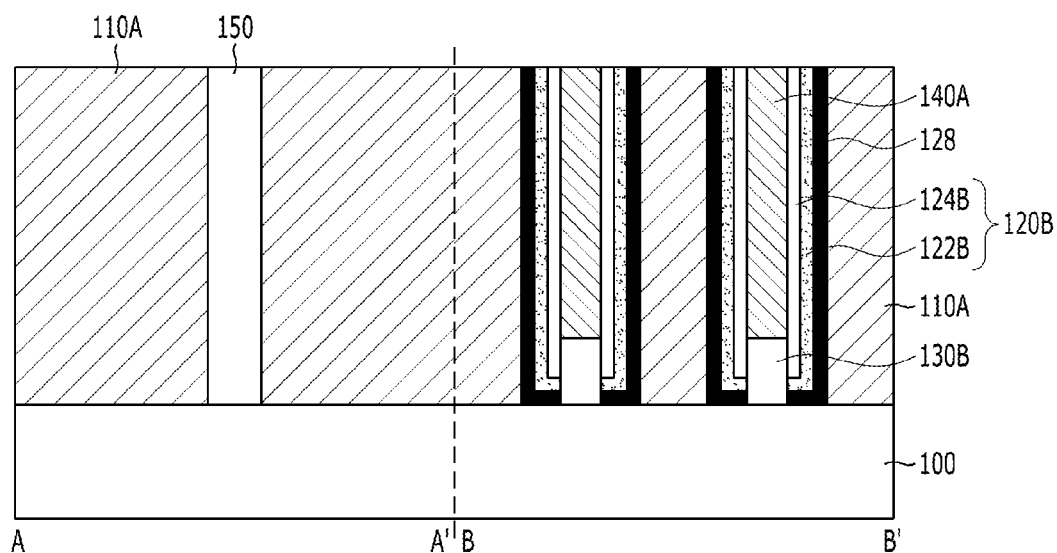
FIG. 7B is a cross-sectional view illustrating a semiconductor device in accordance with a fifth embodiment of the present disclosure.

FIGS. 7A and 7B are cross-sectional views illustrating semiconductor devices in accordance with fourth and fifth embodiments of the present disclosure, respectively. Each of the semiconductor devices shown in FIGS. 7A and 7B includes a selection unit.

Referring to FIG. 7A, a selection layer 126 is interposed between a second electrode 140A and a resistance variable pattern 120B. The selection layer 126 extends upwards by a predetermined height from a substrate.

In an embodiment, since the selection layers 126 are formed of a material having non-linear current-voltage characteristics, a current scarcely flows through the selection layers 126 under a predetermined threshold voltage, but may flow through the selection layers 126 at a voltage level that is equal to or higher than the predetermined threshold voltage. The selection layers 126 may include any of diodes, transistors, varistors, MIT (Metal-Insulator Transition) devices, tunneling barriers, and so forth.

The selection layers 126 may be formed by, after depositing a first material layer and a second material layer for forming the resistance variable patterns 120B, depositing a third material layer for forming the selection layers 126 over the second material layer, and performing a blanket etch process on the first to third material layers. As a result, first resistance variable patterns 122B and second resistance variable patterns 124B are formed to have portions that are bent toward the second electrodes 140A. Each selection layer 126 is formed to be positioned over the bent portion of the second resistance variable pattern 124B.

Referring to FIG. 7B, a selection layer 128 is interposed between a first electrode 110A and a resistance variable pattern 120B, and the selection layer 128 extends upwards by a predetermined height from a substrate.

A selection layer 128 may be formed by depositing a material layer for forming the selection units 128 over a resultant structure after first electrodes 110A are formed, depositing a first material layer and a second material layer for forming resistance variable patterns 120B over the material layer, and performing a blanket etch process on the material layers. As a result, the selection layer 128 is formed to have a portion bent toward a second electrode 140A, and the resistance variable pattern 120B is positioned over the bent portion of the selection layer 128.

Figure 8:
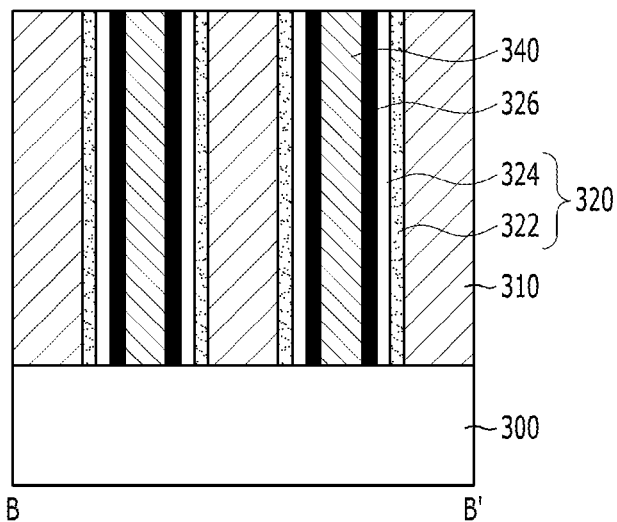
FIG. 8 is a cross-sectional view illustrating a semiconductor device in accordance with a sixth embodiment of the present disclosure.

FIG. 8 is a cross-sectional view illustrating a semiconductor device in accordance with a sixth embodiment of the present disclosure. The semiconductor device further includes selection layers.

Referring to FIG. 8, a selection layer 326 is interposed between a second electrode 340 and a resistance variable pattern 320. The selection layers 326 may be positioned at the same level on a substrate 300 as first electrodes 310, the resistive variable patterns 320, and the second electrodes 340, and may extend to substantially the same height over the substrate 300.

The selection layers 326 may be formed on sidewalls of the resistance variable patterns 320 by depositing a material layer for forming the selection layers 326 over a resultant structure after the resistance variable patterns 320 are formed, and performing a blanket etch process on the material layer.

Although not illustrated in the drawings, in another embodiment, the selection layers 326 may be interposed between the first electrodes 310 and the resistance variable patterns 320. The selection layers 326 may be formed on both sidewalls of the first electrodes 310 before the formation of the resistance variable patterns 320.

According to the embodiments of the present disclosure, which are described above, a semiconductor device having a high degree of integration and uniform cell characteristics may be secured, and may be manufactured with a simplified fabricating process.

The above and other memory circuits or semiconductor devices in accordance with the present disclosure can be used in a range of devices or systems. FIGS. 9-13 provide some examples of devices or systems that can implement the memory circuits disclosed herein.

Figure 9:
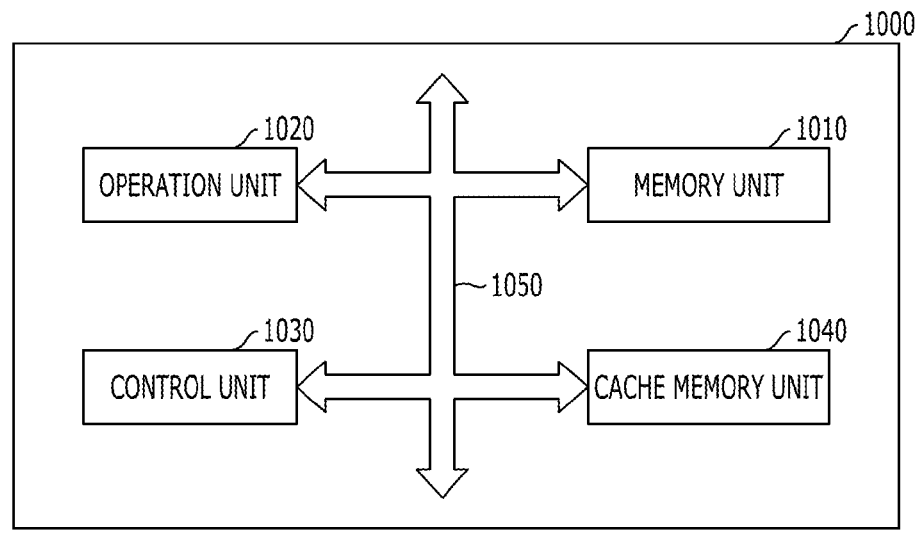
FIG. 9 is a diagram illustrating a configuration of a microprocessor implementing memory circuitry in accordance with an embodiment.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the memory unit 1010 may be raised and data storage characteristics of the memory unit 1010 may be improved. As a consequence, a size of the microprocessor 1000 may be reduced and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
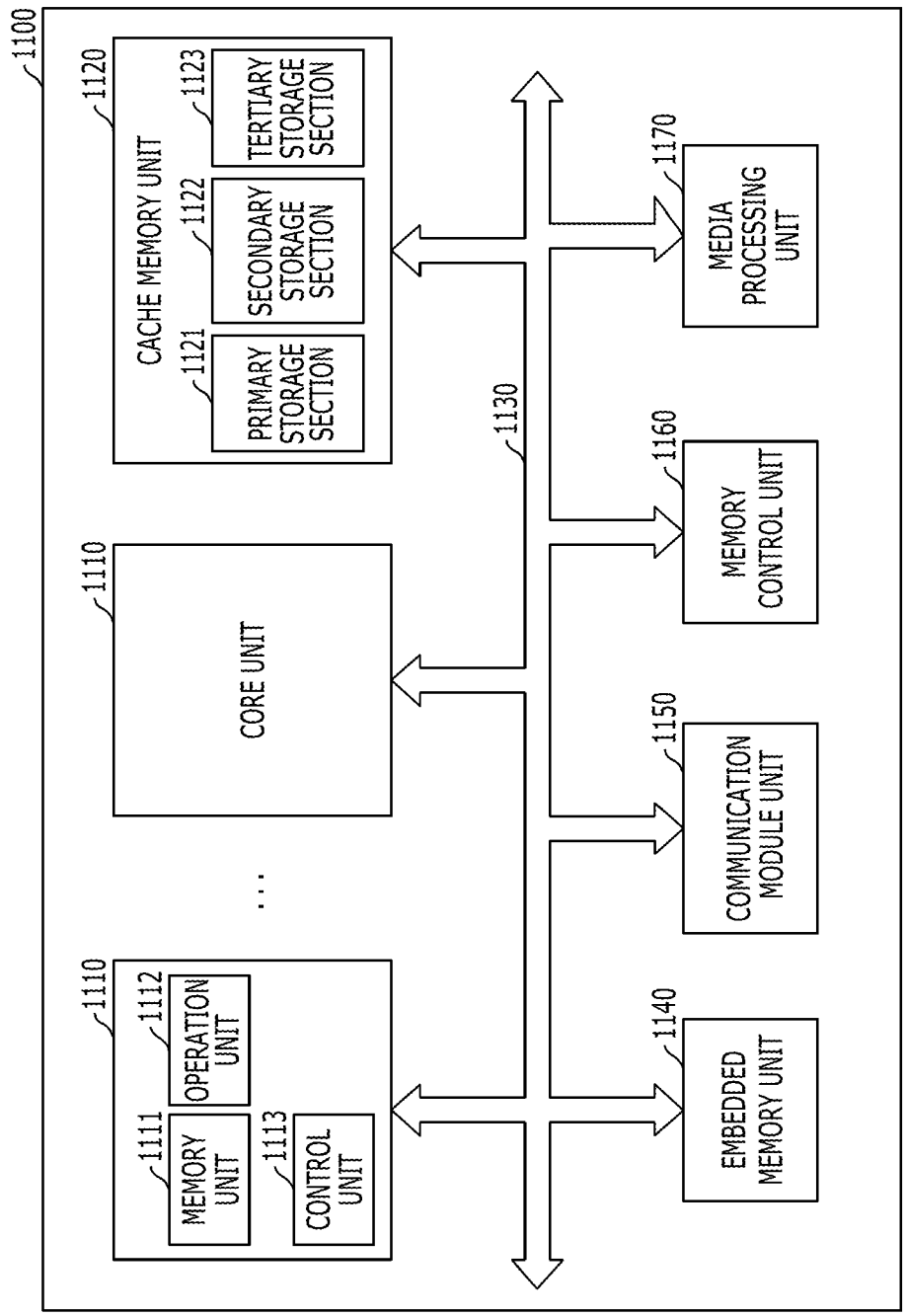
FIG. 10 is a diagram illustrating a configuration of a processor implementing memory circuitry in accordance with an embodiment.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like.

The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the cache memory unit 1120 may be raised and data storage characteristics of the cache memory unit 1120 may be improved. As a consequence, a size of the processor 1100 may be reduced and performance characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
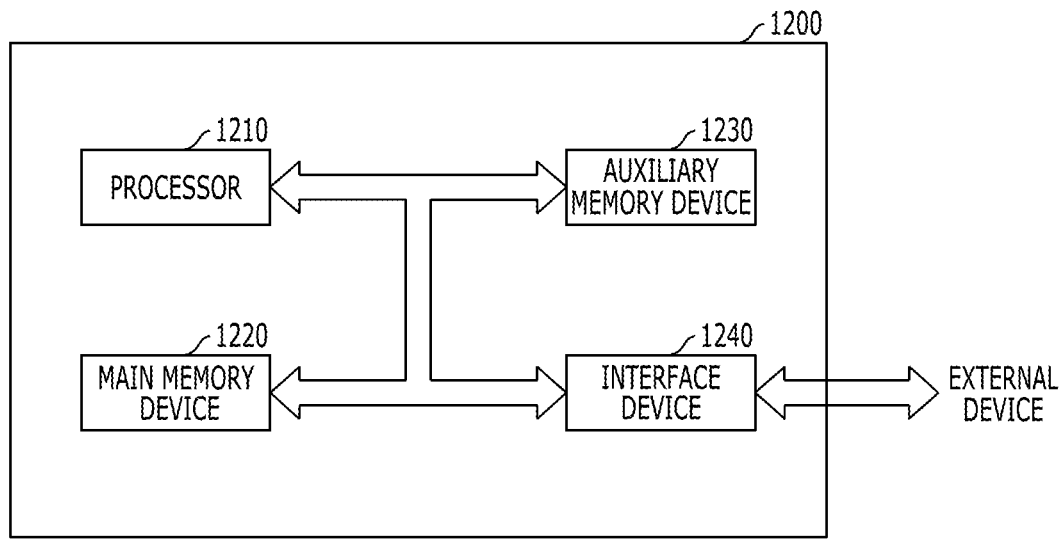
FIG. 11 is a diagram illustrating a configuration of a system implementing memory circuitry in accordance with an embodiment.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the main memory device 1220 may be raised and data storage characteristics of the main memory device 1220 may be improved. As a consequence, a size of the system 1200 may be reduced and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the auxiliary memory device 1230 may be raised and data storage characteristics of the auxiliary memory device 1230 may be improved. As a consequence, a size of the system 1200 may be reduced and performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
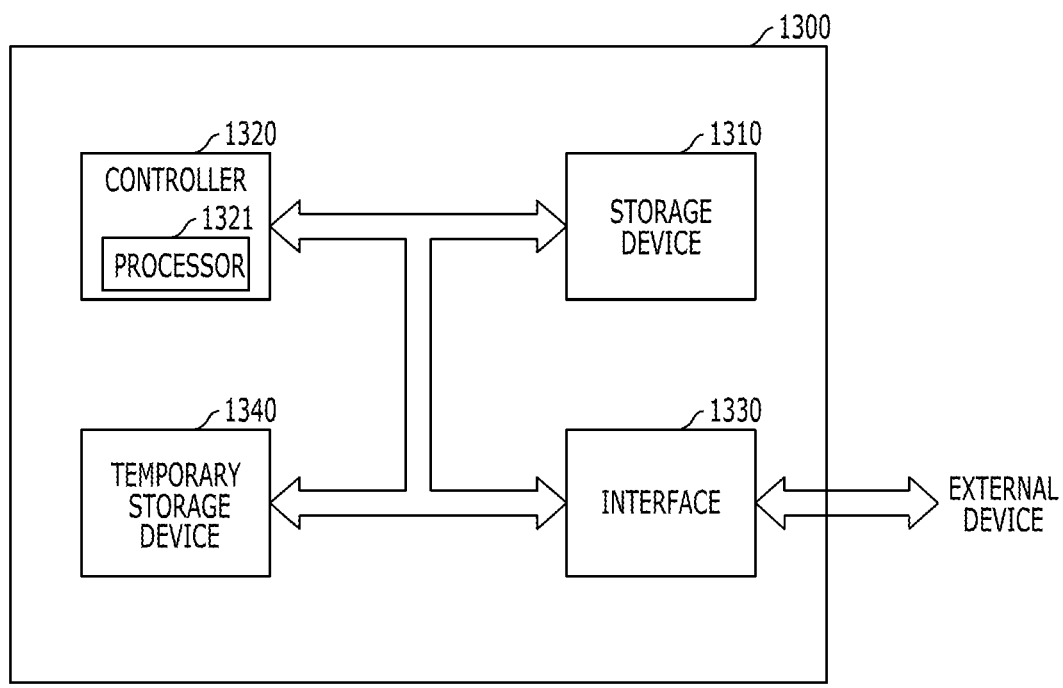
FIG. 12 is a diagram illustrating a configuration of a data storage system implementing memory circuitry in accordance with an embodiment.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the temporary storage device 1340 may be raised and data storage characteristics of the temporary storage device 1340 may be improved. As a consequence, a size of the data storage system 1300 may be reduced and performance characteristics of the data storage system 1300 may be improved.

Figure 13:
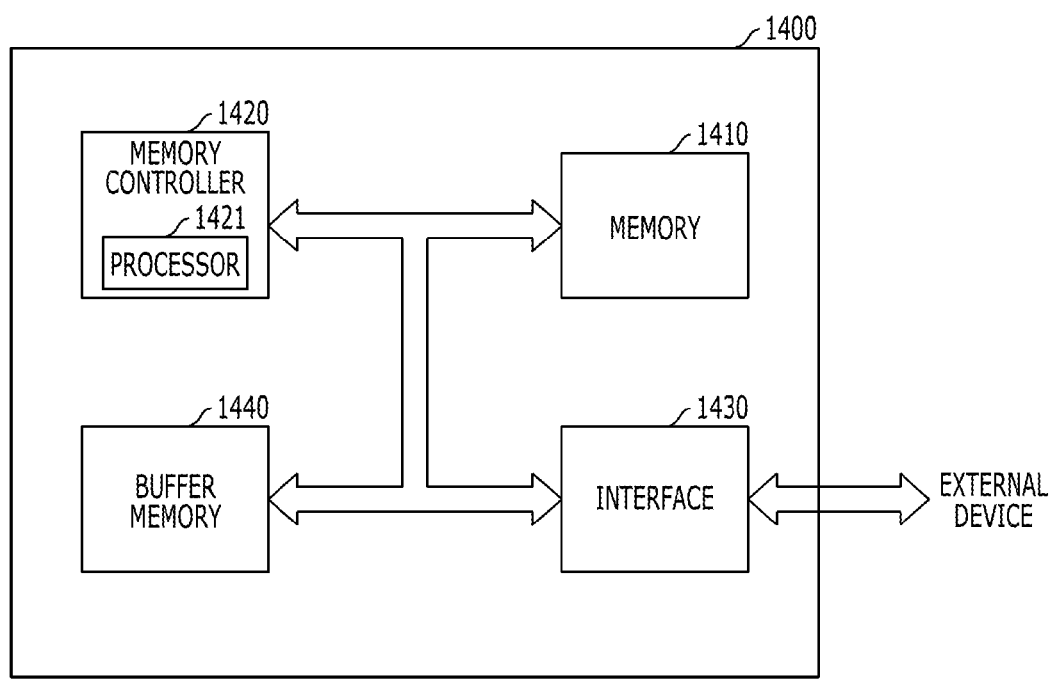
FIG. 13 is a diagram illustrating a configuration of a memory system implementing memory circuitry in accordance with an embodiment.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the memory 1410 may be raised and data storage characteristics of the memory 1410 may be improved. As a consequence, a size of the memory system 1400 may be reduced and performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate. Through this, integration degree of the buffer memory 1440 may be raised and data storage characteristics of the buffer memory 1440 may be improved. As a consequence, a size of the memory system 1400 may be reduced and performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While the present disclosure describes many embodiments, these should not be construed as limitations on the scope of any invention that may be claimed, but rather as descriptions of features that may be specific to particular embodiments of particular inventions. Certain features that are described in the present disclosure in the context of separate embodiments can also be implemented in combination in a single embodiment. Various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be depicted in the drawings in a particular order, this should not be understood as requiring that such operations be performed in the particular order shown or in sequential order, or that all illustrated operations be performed, to achieve described results. Moreover, the separation of various system components in the embodiments described in the present disclosure should not be understood as requiring such separation in all embodiments.

The present disclosure describes implementations and examples of embodiments. Other implementations, enhancements and variations can be made based on what is described and illustrated in the present disclosure.

What is claimed is:

1. An electronic device including a semiconductor memory unit, the semiconductor memory unit comprising: a plurality of first electrodes and a plurality of second electrodes, which are disposed over a substrate and alternately arrayed in a first direction that is parallel to a plane of the substrate; and a plurality of resistance variable patterns, each of which is interposed between a corresponding one of the first electrodes and a corresponding one of the second electrodes, wherein the first and second electrodes and the resistance variable patterns extend upwards by a predetermined height from the substrate; wherein the semiconductor memory unit comprises a plurality of cell structures arrayed in a second direction crossing the first direction, each of the cell structures including first electrodes, second electrodes, and resistance variable patterns that are arrayed in the first direction, wherein each of the first electrodes, the second electrodes, and the resistance variable patterns in each of the cell structures are arrayed in rows in the second direction, and wherein the semiconductor memory unit further comprises: first lines extending in the first direction, each of the first lines being electrically coupled to corresponding first electrodes that are disposed in a corresponding cell structure and arrayed in the first direction: and second lines extending in the second direction, each of the second lines being electrically coupled to corresponding second electrodes that are disposed in the cell structures and arrayed in the second direction, and wherein when the first lines are over the cell structures the second lines are under the cell structures, and when the first lines are under the cell structures the second lines are over the cell structures.

2. The electronic device according to claim 1, wherein upper surfaces of the plurality of first electrodes, the plurality of resistance variable patterns, and the plurality of second electrodes are disposed at substantially the same level over the substrate, and wherein lower surfaces of the plurality of first electrodes and the plurality of resistance variable patterns are disposed at a level that is provided below lower surfaces of the plurality of second electrodes.

3. The electronic device according to claim 2, further comprising:

insulation patterns, each of which is disposed between a corresponding one of the plurality of second electrodes and the substrate.

4. The electronic device according to claim 3, wherein each of the plurality of resistance variable patterns includes a plurality of layers, wherein the plurality of layers, in combination, have resistance variable characteristics, wherein, in each of the plurality of resistance variable patterns, lowermost portions of layers that are not in contact with the corresponding one of the plurality of second electrodes among the plurality of layers have a bent portion that extends toward the corresponding second electrode in a direction parallel to the plane of the substrate, and wherein a corresponding one of the insulation patterns has a top surface disposed over the lowermost portions of the layers that are not in contact with the corresponding one of the plurality of second electrodes.

5. The electronic device according to claim 3, wherein the semiconductor memory unit comprises a plurality of stack structures including first and second stack structures that are vertically stacked over the substrate, each of the stack structures including a plurality of cell structures arrayed in a second direction crossing the first direction, each of the cell structures including first electrodes, second electrodes, first insulation patterns under the second electrodes, and resistance variable patterns that are arrayed in the first direction.

6. The electronic device according to claim 5, wherein the first electrodes of the first stack structure are aligned with the second electrodes of the second stack structure so that the first electrodes of the first stack structure are parallel to and overlap with the second electrodes of the second stack structure, and wherein the second electrodes of the first stack structure are aligned with the first electrodes of the second stack structure so that the second electrodes of the first stack structure are parallel to and overlap with the first electrodes of the second stack structure.

7. The electronic device according to claim 6, wherein the semiconductor memory unit further comprises:

first lines extending in the first direction under the first stack structure, each of the first lines being electrically coupled to corresponding first electrodes that are disposed in a corresponding cell structure included in the first stack structure and arrayed in the first direction;

second lines extending in the second direction between the first stack structure and the second stack structure, each of the second lines being electrically coupled to corresponding second electrodes, which are disposed in the cell structures included in the first stack structure and arrayed in the second direction, and corresponding first electrodes, which are disposed in the cell structures included in the second stack structure and arrayed in the second direction; and third lines extending in the first direction over the second stack structure, each of the third lines being electrically coupled to corresponding second electrodes that are disposed in a corresponding cell structure included in the second stack structure and arrayed in the first direction.

8. The electronic device according to claim 6, wherein the semiconductor memory unit further comprises:

first lines extending in the second direction under the first stack structure, each of the first lines being electrically coupled to corresponding first electrodes that are disposed in the cell structures included in the first stack structure and arrayed in the second direction;

second lines extending in the first direction between the first stack structure and the second stack structure, each of the second lines being electrically coupled to corresponding second electrodes, which are disposed in a corresponding cell structure included in the first stack structure and arrayed in the first direction, and corresponding first electrodes, which are disposed a corresponding cell structure included in the second stack structure and arrayed in the first direction; and third lines extending in the second direction over the second stack structure, each of the third lines being electrically coupled to corresponding second electrodes that are disposed in the cell structures included in the second stack structure and arrayed in the second direction.

9. The electronic device according to claim 1, wherein each of the plurality of resistance variable patterns includes an oxygen-rich metal oxide layer and an oxygen-deficient metal oxide layer, which are laterally stacked over the substrate between the corresponding one of the plurality of first electrodes and the corresponding one of the plurality of second electrodes.

10. The electronic device according to claim 1, wherein upper surfaces of the first electrodes, the resistance variable patterns and the second electrodes are disposed at substantially the same level, and wherein lower surfaces of the first electrodes, the resistance variable patterns and the second electrodes are disposed at substantially the same level.

11. The electronic device according to claim 1, wherein the semiconductor memory unit comprises a plurality of stack structures including first and second stack structures that are vertically stacked over the substrate, each of the stack structures including a plurality of cell structures arrayed in a second direction crossing the first direction, each of the cell structures including first electrodes, second electrodes, and resistance variable patterns that are arrayed in the first direction.

12. The electronic device according to claim 11, wherein the semiconductor memory unit further comprises:

first lines extending in the first direction under the first stack structure, each of the first lines being electrically coupled to corresponding first electrodes that are disposed in a corresponding cell structure included in the first stack structure and arrayed in the first direction;

second lines extending in the second direction between the first stack structure and the second stack structure, each of the second lines being electrically coupled to corresponding second electrodes, which are disposed in the cell structures included in the first stack structure and arrayed in the second direction, and second electrodes, which are disposed in the cell structures included in the second stack structure and arrayed in the second direction; and third lines extending in the first direction over the second stack structure, each of the third lines being electrically coupled to corresponding first electrodes that are disposed in a corresponding cell structure included in the second stack structure and arrayed in the first direction.

13. The electronic device according to claim 11, wherein the semiconductor memory unit further comprises:

first lines extending in the second direction under the first stack structure, each of the first lines being electrically coupled to corresponding first electrodes that are disposed in the cell structures included in the first stack structure and arrayed in the second direction;

second lines extending in the first direction between the first stack structure and the second stack structure, each of the second lines being electrically coupled to corresponding second electrodes, which are disposed in a corresponding cell structure included in the first stack structure and arrayed in the first direction, and electrically coupled to corresponding second electrodes, which are disposed in a corresponding cell structure included in the second stack structure and arrayed in the first direction; and third lines extending in the second direction over the second stack structure, each of the third lines being electrically coupled to corresponding first electrodes that are disposed in the cell structures included in the second stack structure and arrayed in the second direction.

14. The electronic device according to claim 1, wherein the semiconductor memory unit further comprises:

a plurality of selectors each of which is interposed between a first electrode and a resistance variable pattern or between a second electrode and a resistance variable pattern and extends upwards by predetermined height from the substrate.

* * * * *